US005869220A

United States Patent [19]
Hallock et al.

[11] Patent Number: 5,869,220
[45] Date of Patent: Feb. 9, 1999

[54] WATERBORNE PHOTORESIST EMULSIONS AND METHODS OF PREPARATION THEREOF

[75] Inventors: John Scott Hallock, Ellicott City, Md.; Hiroshi Samukawa, Kanagawa-ken, Japan

[73] Assignee: MacDermid Acumen, Inc., Middletown, Del.

[21] Appl. No.: 870,899

[22] Filed: Jun. 6, 1997

Related U.S. Application Data

[63] Continuation of Ser. No. 483,614, Jun. 7, 1998, abandoned.

[51] Int. Cl.$^6$ .................................................. G03F 7/033
[52] U.S. Cl. .................................... 430/281.1; 430/285.1; 430/910; 430/911; 522/84; 522/121
[58] Field of Search ............................. 430/281.1, 285.1, 430/910, 911, 138; 522/84, 121

[56] References Cited

U.S. PATENT DOCUMENTS

| | | | |
|---|---|---|---|
| 3,929,743 | 12/1975 | Sramek | 260/80.8 |
| 3,953,309 | 4/1976 | Gilano et al. | |
| 4,079,028 | 3/1978 | Emmons et al. | 260/29.6 NR |
| 4,100,047 | 7/1978 | McCarty | 204/159.23 |
| 4,114,328 | 9/1978 | Bozzi et al. | 260/24 |
| 4,133,909 | 1/1979 | Spencer | 427/54 |
| 4,151,143 | 4/1979 | Blank et al. | 260/29.6 RW |
| 4,186,069 | 1/1980 | Muzyczko et al. | 430/175 |
| 4,293,476 | 10/1981 | Moore et al. | 260/29.7 W |
| 4,304,703 | 12/1981 | Das | 260/29.6 WB |
| 4,361,640 | 11/1982 | Pine | 430/275.1 |
| 4,426,485 | 1/1984 | Hoy et al. | 524/591 |
| 4,510,230 | 4/1985 | Coveleskie et al. | 430/273.1 |
| 4,564,580 | 1/1986 | Ichimura et al. | 430/281.1 |
| 4,713,298 | 12/1987 | Hung et al. | 428/461 |
| 4,743,698 | 5/1988 | Ruffner et al. | 548/229 |
| 4,943,513 | 7/1990 | Lipson et al. | 430/260 |
| 4,950,580 | 8/1990 | Hilger | 430/281.1 |
| 4,952,481 | 8/1990 | Seio et al. | 430/284.1 |
| 4,965,294 | 10/1990 | Ohngemach et al. | 522/79 |
| 5,045,435 | 9/1991 | Adams et al. | 430/288.1 |
| 5,168,087 | 12/1992 | LiBassi et al. | 502/164 |
| 5,178,988 | 1/1993 | Leech et al. | 430/280.1 |
| 5,232,815 | 8/1993 | Browne et al. | 430/191 |
| 5,320,933 | 6/1994 | Lundy et al. | 430/283.1 |
| 5,364,736 | 11/1994 | Eramo, Jr. et al. | 430/280.1 |
| 5,364,737 | 11/1994 | Barr | 430/281.1 |
| 5,387,494 | 2/1995 | Barr et al. | 430/281.1 |
| 5,389,495 | 2/1995 | Barr | 430/281.1 |

FOREIGN PATENT DOCUMENTS

| | | |
|---|---|---|
| 0493317 | 12/1991 | European Pat. Off. . |
| 0518453 | 12/1992 | European Pat. Off. . |
| 0546768 | 12/1992 | European Pat. Off. . |
| 2257711 | 1/1993 | United Kingdom . |
| 9108840 | 6/1991 | WIPO . |
| 9200552 | 1/1992 | WIPO . |

OTHER PUBLICATIONS

Grant et al, *Grant & Hackh's Chemical Dictionary*, Fifth ed., MacGraw–Hill Book Company, New York, NY 1987) pp. 147, 212, 286.
The *American Heritage Dictionary*, (Houghton Mifflin Company, Boston, MA, 1982), pp. 297, 450, and 619.
F. W. Billmeyer, Texbook of Polymer Science (2d 1962), pp. 343–347.
F. A. Bovey, Emulsion Polymerization (1955), pp. 271–290.
G. E. Ham, Kinetics and Mechanisms of Polymerization, vol. 2 (1967), pp. 259–290.
Choiu et al., Emulsified Photoresist for Printed Circuit Imaging, MRL Bull. Res. Dev.., vol. 2, No. 2 (1988) pp. 13–17.

*Primary Examiner*—Cynthia Hamilton
*Attorney, Agent, or Firm*—John L. Cordani

[57] ABSTRACT

Highly versatile stable photoresist emulsions can be prepared using low levels of neutralization while minimizing the use of surfactants and associative thickeners. High solids, low viscosity waterborne photoresist emulsion compositions are prepared by mixing and comminuting a partially neutralized acid functional latex polymer resin with photopolymerizable monomers and photoinitiators under conditions sufficient to produce a stable emulsion.

9 Claims, No Drawings

WATERBORNE PHOTORESIST EMULSIONS AND METHODS OF PREPARATION THEREOF

This application is a continuation of application Ser. No. 08/483,614, filed Jun. 7, 1995, now abandoned.

FIELD OF THE INVENTION

The present invention is related to the formation of patterned images upon substrates, such as used in the production of printed circuit boards and similar electronic components. More particularly, the invention is directed to novel negative-acting waterborne photoresist emulsion compositions and their use in producing liquid applied and dry film photoresist substrates.

BACKGROUND

It is well established that photosensitive resin compositions may be used as photoresists in the manufacture of printed circuit boards, and the like. Currently, dry film photoresists dominate the market. However, fine line imaging capability of such dry films is limited, because of their inability to conform completely to microscopic variations in the substrate surface (i.e., the copper surface) during lamination. Also, very fine lines tend to be poorly resolvable due to the thickness of such dry film photoresists when combined with the cover sheet (that separates the artwork from the photoresist) during exposure.

As a result, the industry has begun to develop liquid applied photoresist systems. To effectively compete with dry film photoresists, the industry has sought to develop liquid applied photoresists that have the advantages of dry film photoresists (e.g., contact imageability and durability), without their disadvantages (e.g., limitations on fine line imaging and surface contact/adhesion to substrates).

Liquid applied photoresists were initially organic solvent-based systems and solvent developable. Recently, however, in response to health, safety and environmental concerns, the need to reduce and/or remove organic solvents from the preparation of photoresist compositions and photoresist films has become a priority. Waterborne aqueous-developable photoresist compositions have, therefore, been developed to address this need.

In developing waterborne photoresist compositions, the industry has sought to obtain compositions and resulting films that provide the advantages of solvent-based systems. With waterborne photoresist systems, however, the challenge has been to provide compositions that retain their stability, while still being able to form versatile photoresist films. Since stabilization of waterborne photoresist systems has typically required the use of certain additives that can degrade photoresist performance, it is believed that the most versatile photoresist films may be obtained when such additives are limited.

Waterborne photoresist compositions are essentially aqueous emulsions of water-insoluble compounds. These emulsions require stabilization to prevent phase separation of the insoluble compounds. To be effective, these emulsions must be both storage stable and shear stable.

Photoresist emulsion compositions typically require storage stability of at least about 6 months in order to account for formulation time, shelf-time, and shipping time to customers. Photoresist emulsion compositions that are not storage stable for at least about 6 month run the risk of phase separation during storage, shipping, and/or use. Should phase separation occur, the emulsion would become completely unusable, significantly impacting upon manufacturing costs. Therefore, the industry typically demands that photoresist emulsions have a storage stability of at least about 6 months.

Stabilization is also necessary due to the processing requirements and intended application of these photoresist emulsions. These aqueous emulsions are frequently subject to high shear conditions in the manufacturing process, especially in the case of direct emulsification of previously synthesized polymers. In many cases, the photoresist emulsions are then concentrated by evaporation of water and/or organic solvents, often under vacuum and with heat and mechanical shear stress (e.g., wiped filmed evaporators). In cases where organic solvents are emulsified along with other water-insoluble components, the evaporation process itself can be mechanically stressful, as solvent vapors must pass through the surfactant boundary, thus disrupting the stabilizing forces.

Furthermore, photoresist emulsions are frequently formulated with other additives using high shear to mix the components. Additives such as water-dispersible thickeners and organic co-solvents can, however, destabilize emulsions and increase their sensitivity to mechanical and/or thermal stress. Although the exact mechanism is not clear, it is believed that additives tend to make emulsions more susceptible to coagulation.

Application methods may also require high shear stability, especially with regard to spray- and roll-coating processes. Therefore, it is necessary that photoresist emulsion compositions do not degrade or coagulate under high shear conditions.

Emulsifiers and other surfactants are commonly used to overcome emulsion and shear stability problems in aqueous emulsion photoresist systems. However, high levels of surfactants are often required to provide sufficient stability, which can negatively impact upon film formation and the performance characteristics of dried films.

The use of high levels of surfactants can, for example, result in foam stabilization problems in the emulsion during high shear processes, which can lead to the formation of bubbles or pin holes in the final film product. Excessive surfactant levels can also lead to adhesion failure in dried films at the substrate/coating interface, due to their tendency to migrate to the interface surface. Excessive levels of surfactant can further lead to increased sensitivity of the dried films to water or humidity, due to their hydrophilicity. Moreover, an increase in the hydrophilic character of photoresists (by, e.g., the use of increasing levels of surfactants) tends to both increase the developing rate to impractically high speeds and reduce the resistance of the photocured regions to attack by the developer. Therefore, the use of high levels of surfactants to achieve emulsion stability for waterborne photoresist systems is not favored.

Recently, practitioners have turned their focus to stabilizing aqueous photoresist emulsion systems by neutralizing the acid functional polymer of the photoresist emulsion with base. For example, in U.S. Pat. No. 5,045,435, a waterborne, alkali-developable, photoresist coating composition is disclosed which is said to comprise a multifunctional monomer, a photoinitiator, and a latex of a water insoluble carboxylated acrylate polymer, in which at least 25% of the acid groups of the latex are neutralized. It is stated that a stable photoresist emulsion may be prepared by neutralization at levels greater than at least 25% with a base such as ammonia, and more typically at about 30% to 60%, to achieve desired stability and viscosity.

However, it has been found that while high degrees of neutralization, as required in U.S. Pat. No. 5,045,435, may impart desired Theological properties such as higher viscosity, thereby contributing to emulsion stability, this is achieved by sacrificing film properties. More specifically, increased levels of neutralization tend to reduce chemical resistance of the dried films, since the neutralizer in reacting with the acid functional polymer produces water soluble salts that are not all removed during drying, and become sites for potentially damaging chemical attack. Furthermore, it has been found that at high levels of neutralization, these emulsions become so viscous that they require dilution, to be suitable for coating processes, even at relatively low solids levels. Moreover, it is believed that high levels of neutralization can cause destabilization of these emulsions.

More recently, practitioners have made efforts to overcome these problems by reducing the levels of neutralization, thereby necessitating the use of other additives, emulsifiers and/or other surfactants, to compensate for the loss of rheological properties attendant with high neutralization.

For example, thickeners are well known in the art and commonly used for their ability to adjust rheology of pre-formed emulsions by increasing viscosity (i.e., thickening the emulsion). Although associative thickeners are predominantly used, non-associative thickeners may also be used. Associative thickeners, when used for adjusting rheology of photoresist emulsions, are typically used in the range of about 0.1 wt. % to about 2.0 wt. % (on a weight basis of thickener solids to total solids in the emulsion).

U.S. Pat. No. 4,426,485 discloses that certain associative thickeners are useful in enhancing particle wetting of materials being added to a resin system (i.e., acting as surfactants).

U.S. Pat. No. 5,364,737, employs associative thickeners in combination with polymer neutralization of less than or equal to about 20% for a photoresist composition. The patent claims to the use of a polyether polyurethane associative thickener in amounts of from about 1 wt. % up to about 40 wt. %. It is stated in Example 3 that the use of a polyether polyurethane associative thickener at about 2.78 wt. % (on a weight basis of thickener solids to total solids in the emulsion) results in a film with slight ribbing; in Example 4, it is stated that use of about 5.56 wt. % a polyether polyurethane associative thickener results in a film with no ribbing.

U.S. Pat. No. 5,364,737, more specifically, discloses a waterborne photoimagable composition comprising a partially neutralized ($\leq 20\%$) latex binder polymer having carboxylic acid functionality, ethylenically unsaturated monomers, a photoinitiator, and at least about 1 wt. % to about 40 wt. % of a polyether polyurethane associative thickener. The associative thickener is used for the dual purpose of adjusting viscosity and as a surfactant to emulsify the monomer fraction, thereby helping to stabilize the latex emulsion of the binder polymer. The associative thickener is, thus, used in, (1) forming a waterborne emulsion of the latex binder polymer, monomers, photoinitiator, and conventional additives and (2) improving the rheology of the stabilized emulsion.

In comparison with the levels of associative thickener used by skilled artisans to adjust rheology of photoresist emulsions, U.S. Pat. No. 5,364,737, requires relatively high levels of about 1 wt. % up to about 40 wt. % of associative thickener to substantially reduce the level of neutralization of the latex polymer. These required high levels of associative thickener, however, have their own set of disadvantages relating to the nature and level of solids in the emulsion, during photoresist emulsion formation, and to the final film properties in the dried film.

The term "solids" when referring to photoresist emulsions is meant to include all of the non-volatile components of the emulsion that remain in the film when dried. The "solids" in a photoresist emulsion will, therefore, comprise the non-volatile portions of: latex polymers, monomers, photoinitiators, thickeners, surfactants, neutralizing base, and any other non-volatile additives.

The required presence of associative thickeners in emulsion formation of the '737 patent places limits not only on the ultimate total solids content of the emulsion due to viscosity effects, but also on the proportionate distribution of the active photoimageable components (e.g., polymer, monomer, photoinitiator, dye) to the inactive non-volatiles (e.g., thickener, surfactant, defoamer, flow control agent) in the emulsion.

Limiting the total solids content of the emulsion, in turn, limits film thickness that can be reasonably achieved with various application techniques including spray coating, dip coating and roll coating. These application techniques cannot typically tolerate extremely viscous fluids since such materials tend not to flow and level properly after contact with the substrate, or may encounter difficulty in actually transferring to the substrate.

With respect to film thickness, in a given application process optimized for a material with a certain viscosity range, a one mil thick wet coating might be expected to provide a 0.25 mil thick dry coating in the case of a 25% solids emulsion and a 0.5 mil thick dry film in the case of a 50% solids emulsion, based on total solids in the emulsion. In short, the higher the solids content of the emulsion, the thicker will be the resulting film. Perhaps, more importantly, though is the versatility that is achieved with a higher solids content, because such versatility allows for tailoring the solids/rheology of the emulsion to differing requirements of manufacturing equipment and desired products. This is particularly important in achieving fine line resolution (i.e., sharpness) in a film of a given thickness.

Thus, there exists the need for stable, viscosity-adjustable waterborne photoresist emulsions in which the total amount of solids in the emulsion can be tailored to specific needs, including very low solids (<20%) to very high solids (45–60%).

The presence of relatively high levels of associative thickeners in photoresist emulsions, as in U.S. Pat. No. 5,364,737, tends to promote "tack" and/or "blocking" in the dried film. In the preparation of photoresists, it is usually necessary to bring the dried photoresist film into contact with a phototool (or "photographic" negative) through which it is exposed to actinic light. "Tack" refers to stickiness without transfer from the film, of some of the photo-imageable composition when the film is brought into contact with a negative. "Blocking" refers to sticking with transfer between two surfaces of the same material, encountered during stacking of uncured photoresist panels. It is, therefore, important for photoresist films to exhibit anti-tack and anti-blocking, since stickiness and/or transfer of photo-imageable composition to the negative can at least necessitate cleaning of the negative, if not destroy it completely.

Another problem with prior art photoresist emulsion materials is that, following coating onto a substrate and drying, they usually cannot be stacked for compact storage. Although the prior art has addressed anti-tack, with respect to contact imageability of negatives by the use of slip aids, the issue of stackability of photoresists has remained unresolved.

During processing of photoresists, it is often necessary that the coated substrate photoresists, such as coated circuit boards, be taken off-line and stored. This may be due to work stoppages, for example, because of equipment failures, personnel situations, holidays, or any other curtailment of the production line.

In the past, coated substrate photoresists have not been able to be stacked because the pressure exerted on multiple layers of coated photoresists of the prior art have exhibited blocking. This blocking is believed to be caused by the presence of relatively high levels of thickener, especially associative thickeners, and certain surfactants, in the formation of the photoresist emulsions that remain as inactive non-volatiles in the dried film. It is, therefore, believed that stackability can also be achieved by limiting the amount of thickeners, especially associative thickeners, and certain surfactants in the formation of photoresist emulsions.

Consequently, there exists a need for photoresist emulsion compositions, and processes for making such compositions, which meet the requirements for a waterborne, liquid applied contact imageable photoresists that provide storage and shear stable emulsions having high solids and low viscosity while minimizing the need for neutralization of the acid-functional polymer latex and minimizing the use of additives such as thickeners and surfactants. There is a further need for such photoresist compositions which when coated and dried onto a substrate material exhibit sufficient anti-blocking properties to provide photoresist substrates that are capable of being stacked.

SUMMARY OF THE INVENTION

Therefore, it is an object of this invention to provide photoresist compositions which are waterborne and aqueous alkali developable which possess improved storage and shear stability while requiring no volatile organic solvents in preparation, manufacturing and/or use.

It is another object of the present invention to provide waterborne, photoresist compositions which have increased stability in the presence of conventional additives while minimizing the use of thickeners and surfactants.

It is yet another object of the present invention to provide waterborne, photoresist emulsion compositions which have increased stability, high solids and low viscosity in the presence of conventional additives while minimizing the use of thickeners and surfactants.

It is yet another object of the present invention to provide a roll-coatable, waterborne, aqueous alkali developable photoresist composition which is both storage stable and shear stable.

It is a related object of this invention to provide methods for the stabilization of negative-acting, waterborne, photoresist compositions while minimizing the use of thickeners and surfactants.

It is a general object of this invention to provide waterborne photoresist compositions and methods for effectively coating and selectively protecting substrate surfaces during the production of printed circuit boards and other electronic components.

The present invention is directed to new and useful aqueous photoresist emulsion compositions which can be characterized by increased storage and shear stability, and which are prepared from acid functional resins. In particular, the present invention comprises an aqueous emulsion of a latex of acid functional resin, photopolymerizable monomers, and photoinitiator; wherein up to about 22% of the acid functional groups are neutralized with base.

These components can be combined in a variety of sequences to achieve the present invention. Typically the acid functional resin is partially neutralized up to about 22%. The photopolymerizable monomer, photoinitiator, and dyes are mixed together to form a solution. This solution is then added to the partially neutralized latex. The two phase mixture is then comminuted under conditions sufficient to achieve a stable emulsion.

The present invention is also directed to photoresists films (both liquid applied and dry film) prepared from the emulsion compositions of the present invention that have fine line imaging capability, anti-tack and anti-blocking properties, and which are stackable.

DETAILED DESCRIPTION OF THE INVENTION

It has been found that stable photoresist emulsions can be prepared using low levels of neutralization, while minimizing the use of surfactants and thickeners, especially associative thickeners. Emulsions prepared in the manner of the present invention exhibit high solids and low viscosity. Dried photoresists films prepared from these emulsions exhibit anti-block and improved anti-tack properties, and are stackable; and photoresists are capable of fine line imaging.

Photoresist compositions essentially comprise acid functional polymers, photopolymerizable monomers and photoinitiators. The acid functional polymers are in the form of latex emulsions. Photoresist emulsion compositions are then prepared by combining the polymer lattices with monomers and photoinitiator, as well as conventional additives (e.g., dyes, etc.).

The polymer lattices are prepared using art recognized techniques. A polymer latex is usually prepared from water-insoluble monomers that are suspended in water using surfactants, followed by polymerization, such as emulsion polymerization. Polymer lattices currently available, therefore, comprise a source of surfactant for the photoresist emulsion.

A typical emulsion polymerization is described in U.S. Pat. No. 3,929,743. Suitable polymerization initiators include free radical generators such as peroxy disulfates and persulfate-iron-bisulfate or metabisulfate systems. Detailed techniques, methods and conditions for emulsion polymerization are described in F. W. Billmeyer, *Textbook of Polymer Science* (Wiley-Interscience, New York; 2ed 1971); K. Boevy, et. al., *Emulsion Polymerization,* (Interscience Publishers, Inc.; New York 1955); and G. M. Dekker, *Kinetics and mechanisms of polymerization,* Vol. 1 (Ed. by G. E. Ham 1969.

Typically, in the preparation of photoresist emulsions, further surfactant and/or an emulsifier is required when combining the monomers and photoinitiators with the polymer latex. Additional surfactant and/or emulsifier is typically used in the art to stably incorporate the added components into the emulsion. It is believed that prior to the present invention, incorporation of the monomers and photoinitiators to photoresist emulsion required the use of such agents.

Stabilization may be achieved using surfactants, emulsifiers (such as associative thickeners), and/or by neutralization of some portion of the acid groups of the acid-functional polymer latex. However, all of these previously known methods of stabilization can have certain disadvantages, especially when used at relatively high levels.

Of the various types of stabilization, neutralization may be the least deleterious, particularly when used at relatively low levels, i.e., partial neutralization. However, before the present invention, partially neutralized photoresist emulsions, with neutralization at less than about 25%, required the addition of emulsifiers (e.g., associative thickeners) to stabilize the emulsion.

It has been presently discovered that stabilization of photoresist emulsions may be achieved by comminution of the acid functional polymers, photopolymerizable monomers and photoinitiators of the photoresist composition. More particularly, it has been discovered that comminuting a solution of the monomers and photoinitiators in the presence of a partially neutralized latex polymer, under suitable conditions, will produce storage and shear stable photoresist emulsions. These photoresist emulsions are prepared without additional surfactant or emulsifier, providing high versatility in the solids/rheology of the emulsions, including compositions of high solids and low viscosity.

The photoresist emulsions of the present invention are superior to those of the prior art because even when low levels of neutralization are used in the present invention, i.e., less than about 22% neutralization, no further surfactants or emulsifiers (i.e., associative thickeners) need to be added to stabilize the emulsion. Although the exact mechanism is not clearly understood, it is believed that the partially neutralized latex has surfactant-like properties, which aid in stabilizing the emulsion. It is further believed that the partially neutralized latex having surfactant-like properties serves as an emulsion promoter to the monomer fraction when the monomers and photoinitiators are added to the emulsion, followed by comminution. The partially neutralized latex may act as a "polymeric surfactant" that, in effect, provides the emulsion with sufficient excess "surfactant" that obviates the need for additional surfactant and/or emulsifier.

Photoresist films prepared from the emulsions of the present invention provide anti-blocking properties, improved anti-tack, and increased chemical resistance.

The photoresist emulsions of the present invention are prepared by comminution. During and/or after comminution, it is believed the particles of the monomers are absorbed into the micelles of the latex polymer. By the action of the polymer absorbing the monomer particles, the monomer particles are effectively incorporated into the interstitial spaces of the polymer in the system. Therefore, there is no need for additional surfactant or emulsifier to emulsify the monomer fraction.

Low level partial neutralization of the latex polymer prior to comminution with the monomer fraction further stabilizes the resulting emulsion. Partial neutralization of the acid functional latex polymer is carried out with suitable base so that less than about 22% of the acid groups are neutralized, preferably between about 20% to about 1%, and most preferably between about 15% to about 5%.

It has been found that the threshold for partial neutralization, with a base, of the acid groups of an acid functional polymer latex in a photoresist composition is about 22%, above which the deleterious effects of large viscosity increases in the emulsion and reduced chemical resistance in the dried film are seen. By neutralization at less than about 22%, these deleterious effects can be avoided.

In addition to advantages of increased compatibility with certain additives and greatly improved shear stability, partially neutralizing the acid functional resin in the emulsion at less than about 22% provides a relatively low viscosity in the emulsion. At the higher level of neutralization, the viscosity may increase substantially due to solubilized resins in the continuous phase of the emulsion. The rheology, e.g., shear thinning or thixotropic characteristics of the emulsion, may also be adversely affected by a highly neutralized dissolved resin. In addition, the lower level of neutralization, i.e., 22% or less, allows the emulsion to be prepared to a higher percent of solids without the emulsion obtaining an impractically high viscosity.

Comminution may be done by any suitable means and under any suitable conditions that induce the formation of a stable photoresist emulsion of the partially neutralized polymer latex with the monomers and photoinitiators. Comminution may, accordingly, be accomplished by ultrasound, homogenization, mixing, milling, or any other techniques known in the art, under suitable conditions. Examples of some suitable means of comminution include, but are not limited, to the following: ultrasonic devices, homogenizers, high shear mixers, colloid mills, and the like. The use of ultrasound and/or homogenization are preferred.

It will be recognized by those of skill in the art that the particular parameters necessary to achieve comminution are dependent upon a number of factors generally related to the materials and processing. This may include, for example, the specific components selected for comminution, the relative amounts of the selected components, the level of partial neutralization of the latex polymer component, the gross amount of all of the components (e.g., size of the batch, if a batch operation system), the comminution means, and the like. Although the inventors do not wish to be held to any specific parameters for comminution, the following general parameters are contemplated to be within the scope of the present invention. For example, when homogenization means are used, a meaningful parameter is believed to be pressure, that is contemplated to be in the range of about 500 to 20,000 psi, preferably about 2000 to 12,000 psi, and most preferably about 6000–12,000 psi. As another example, when ultrasound is the comminution means, meaningful parameters are believed to be power, contemplated be in the range of about 50 to 500 W, and preferably 100 to 200 W, and temperature, contemplated to be less than about 95° C., preferably less than about 80° C., and most preferably less than about 60° C.

Comminution combined with partial neutralization of the latex polymer, in the present invention, obviates the need for additional surfactants and emulsifiers in the preparation of the photoresist emulsions. This results in certain properties in the emulsion, and dried films prepared from such emulsions, heretofore unachievable in waterborne photoresist systems. In the emulsion, the advantages include the ability to produce high solids photoresist emulsion having low viscosity, thereby allowing for versatility in solids/rheology composition of produced emulsion.

Emulsions produced by the present invention are presently contemplated to include emulsions with total solids of greater than about 25 wt. % solids, preferably greater than about 35 wt. % solids, and most preferably greater than about 45 wt. % solids.

Although the inventors do not wish to be bound by any particular viscosity range, it is generally contemplated that the stabilized emulsion obtained by the present invention, prior to viscosity adjustment, is generally in the range of about 10 cP to about 500 cP.

Viscosity may be adjusted my known means, including the use of thickeners. When thickener are used in the present invention, they are contemplated for their commonly known purpose of adjusting viscosity after a stable emulsion has been formed. As used in the present invention, the contemplated thickeners include both associative and non-associative thickeners. As will be recognized by those skilled in the art, the amount of thickener that may be used in the present invention to adjust viscosity depends on the type of thickener used, the viscosity of the pre-adjusted emulsion, and the desired viscosity. However, it is specifically contemplated that the amount of associative thickener that may be used in the present invention to adjust for rheology will be less than about 0.8 wt. %, preferably less than about 0.75 wt. %, more preferably less than about 0.7 wt. %, and most preferably less than about 0.6 wt. % based on the total solids in the emulsion. Non-associative thickeners are contemplated for use at levels that would be apparent to those of skill in the art.

The photoresist emulsions described herein are optimally stable if the particle size distribution, D(v, 0.9), is less than about 1.4 microns, and preferably less than about 1.0 microns. By using the technique of partial neutralization of the acid functional resin and comminution of the photoresist components such particle sizes are readily obtainable as is demonstrated in the examples discussed below.

Films prepared from the emulsions of the present invention advantageously show anti-blocking and improved anti-tack properties. Significantly, in films prepared from emulsions of the present invention, the degree of anti-blocking is such that stackability of photoresist substrates in now achievable. As demonstrated in the Examples, dried film photoresists prepared from the presently described emulsions withstood stacking pressures of at least about 0.66 psi without any transfer (i.e., blocking) of the dried film photoimageable material. This is equivalent to the pressure exerted on the bottom substrate of a stack of about 450 copper substrates for 72 hours (where the substrates were 18"×24", 12 mil core laminate, with 1 oz. of copper on each side, and coated with a 0.5 mil thick dried film of the present invention). These dried film photoresists also showed improved anti-tack since they did not stick to any of the artwork (which is the standard criteria for tack). This anti-tack/anti-blocking property is indicative of the ability of substrates prepared from emulsions, and dried films, of the present invention to withstand the rigors of processing including being stackable for compact storage.

In general, photoresist compositions in accordance with the present invention are storage and shear stable waterborne photoresist emulsions comprising,
  (a) acid functional latex polymers;
  (b) photopolymerizable monomers; and
  (c) photoinitiators; wherein the latex is neutralized with a base up to about 0.22 equivalents per acid equivalent of the resin, and wherein the emulsion of components (a)–(c) further comprise, (d) less than about 0.8 wt. % solids of a thickener.

In a preferred embodiment, the waterborne photoresist emulsion composition of the present invention comprises,
  (a) between about 30 wt. % and about 80 wt. % solids of acid functional polymer having an acid number between about 50 and about 300;
  (b) between about 15 wt. % and about 50 wt. % solids of alpha, beta-ethylenically unsaturated monomers; and
  (c) between about 0.1 wt. % and about 25 wt. % solids of photoinitiator; and
wherein the polymer component (a) is neutralized up to about 0.22 equivalents per equivalent of acid functionality, and wherein the emulsion of components (a)–(c) further comprises, (d) less than about 0.8 wt. % solids of an associative thickener.

A method of preparing a photoresist emulsion composition of the present invention comprises the steps of,
  (a) partially neutralizing an acid functional latex polymer resin with base up to about 0.22 equivalents per acid equivalent of the resin,
  (b) mixing the partially neutralized latex with a solution of photopolymerizable monomers and photoinitiators,
  (c) comminuting the neutralized mixture under conditions sufficient to form a stable emulsion, and
  (d) adding to the stable emulsion less than about 0.8 wt. % solids of an associative thickener to adjust rheology.

In a preferred embodiment of the present invention, the emulsion is comminuted until a particle size distribution having a D(v,0.9) no greater than 1.4 microns is obtained.

Acid-functional latex polymer resins useful in the photo-imageable composition of the present invention are typically prepared by emulsion polymerization of alpha, beta-unsaturated monomers, such as vinyl, acrylate or styrene monomers. Sufficient acid functional monomers are used to provide the acid number of between about 50 and about 300, preferably at least about 80. A typical emulsion polymerization procedure and some examples of suitable emulsions are found in U.S. Pat. No. 3,929,743, the teachings of which are incorporated herein by reference. Suitable emulsions can also be obtained commercially, e.g., Neocryl® CL-340 (40% solids) available from ICI Resins U.S. and Acrysol® I-2074 (46% solids) available from Rohm and Haas.

Suitable acid functional monomers for use in forming the acid functional binder polymer have the formulae:

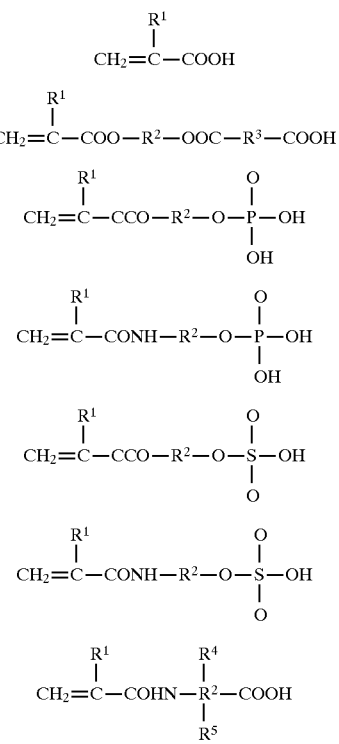

wherein $R^1$ represents a hydrogen atom or a methyl group; $R^2$ represents $(CH_2)_n$ wherein n is an integer of 1 to 6; $R^3$ represents a $C_1$–$C_6$ alkylene group or a phenylene group; and $R^4$ and $R^5$ are not both OH.

Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the latex polymer. The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethyacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol diacrylate, polyoxyethyl-2-2-di(p-hydroxyphenyl)-propane dimethyacrylate, triethylene glycol dimethacrylate, polyoxypropyltrimethylol propane triacrylate, ethylene glycol dimethyacrylate, butylene glycol dimethacrylate, 1,3-propanediol dimethacrylate, butylene glycol di-methacrylate, 1,3-propanediol dimethacrylate, 1,2,4-butanetriol trimethacrylate, 2,2,4-trimethyl-1,3-pentanediol dimethacrylate, pentaerythritol trimethyacrylate, 1-phenyl ethylene-1,2-dimethacrylate, pentaerythritol tetramethacrylate, trimethylol propane trimethacrylate, 1,4-pentandeiol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

Additional resins which are suitable for the photoresist emulsions include, but are not limited to, acid containing copolymers of one of the following monomers; styrene, butadiene, isoprene, vinylidene chloride, methyl acrylate, ethyl acrylate, butyl acrylate, methyl methacrylate, ethyl methacrylate, butyl methacrylate, acrylonitrile, acrylic acid, itaconic acid, methacrylic acid, vinyl alcohol, maleic anhydride and vinyl acetate. Specific copolymers may include: butadiene/acrylonitrile/methacrylic acid, styrene/acrylic acid,
styrene/butadiene/acrylic acid,
styrene/butadiene/methacrylic acid,
styrene/butadiene/itaconic acid,
styrene/butadiene/maleic acid,
styrene/butadiene/butylacrylate/acrylic acid,
styrene/butadiene/butylacrylate/methacrylic acid,
styrene/butadiene/butylacrylate/itaconic acid,
styrene/butadiene/butylacrylate/maleic acid,
styrene/ethyl acrylate/methacrylic acid,
styrene/methacrylic acid, and
vinylidene chloride/methacrylic acid and mixtures of two or more of the foregoing.

It is within the scope of the invention to use a blend of resins. When using a blend of resins it is not critical that all resins comprising the blend be acid-functional. Whether using a resin or resin blend, the resin component of the composition must have an acid number of about 50 to about 300.

So that the photoimageable composition is contact imageable, i.e., dries to a tack-free state, the glass transition temperature ($T_g$) of the latex binder polymer is preferably at least about 60° C. as measured by Differential Scanning Colorimetry (DSC). The polymers have a weight average molecular weight (Mw) of between about 500 and about 200,000 as measured by gel permeation chromatography (GPS) using a polystyrene standard.

To produce the image, these negative-acting photoimageable composition contain photopolymerizable monomers, particularly alpha, beta-ethylenically unsaturated monomers, including a substantial portion of multifunctional monomers. Useful monomers include those, listed above, used to form the latex polymers. The monomer fraction may include both water-soluble and water-insoluble monomers.

Suitable negative-acting photopolymerizable monomers include generally, but are not limited to, acrylates. More specifically, they include acrylic and methacrylic acid esters of mono-, di-, and polyhydric alcohols; and mono-, di-, and polyalkoxy acrylate and methacrylate and mixtures thereof.

Also suitable are mono-, di-, poly- acrylates or methacrylates which are derivatives from the reaction of hydroxyl terminated acrylate or methacrylate esters with mono-, di-, and polyisocyanates, epoxides, and other hydroxy reactive compounds. Specific examples include:

ethylene glycol diacrylate,
ethylene glycol dimethacrylate,
propylene glycol diacrylate,
propylene glycol dimethacrylate,
trimethylolpropane triacrylate,
trimethylolpropane ethoxylate triacrylate,
trimethylolpropane propoxylate triacrylate,
trimethylolpropane ethoxylate trimethacrylate,
trimethylolpropane propoxylate trimethacrylate
bisphenol A diacrylate,
phenoxyethyl methacrylate,
hexandediol diacrylate,
neopentyl glycol diacrylate,
neopentyl propoxylate diacrylate,
pentaerythritol triacrylate,
dipentaerythritol hydroxypentaacrylate, and
polyethylene glycol diacrylate and mixtures of two or more of the foregoing.

Trimethylolpropane ethoxylate triacrylate is a preferred monomer and is available as Photomer® 4149 and 4155 from Henkel Corporation. Other preferred negative acting acrylate monomers prepolymers include those known under the Trademark Sartomer® 454, 205, 399 from Sartomer Co.

The photoresist emulsions of this invention are negative-acting photoresist compositions. As is well known in the art, a negative-acting photoresist material is a photopolymer which is polymerized upon exposure to actinic radiation and becomes insoluble or less soluble in the developer solution. It is within the scope of the invention that the resin and photoinitiator or photopolymerizable components be chemically separate components or they may be chemically bound together. Esacure KIP (oligo[4-(alpha-hydroxyisobutyryl)-alpha-methylstyrene) from Sartomer Inc. is an example of resin and photoinitiator chemically bound. An example of the chemically bound resin and photopolymerizable component is styrene/maleic anhydride copolymer functionalized with hydroxyethyl acrylate or similar acrylate functionality such as Sarbox SB-401 from Sartomer Inc.

The ratio of resin to photopolymerizable monomer in the emulsions can vary widely provided that the dried photoresist film is substantially tack-free. Parameters that tend to affect the level of tack in the film in addition to this ratio are the $T_g$ of the resin(s), the level and type of neutralizing base, and the presence of certain additives, especially surface-active additives that reduce tack (e.g., wax emulsions and modified polydimethylsiloxanes).

When using the photopolymerizable monomers as described above, it is necessary to use a photoinitiator. Suitable photoinitiators for initiating polymerization of the negative acting photopolymers with UV radiation include, but are not limited to, benzoin ethers, benzil ketones, and phenones and phenone derivatives and mixtures of two or more of the foregoing. The amount of photoinitiator in the composition is in the range of about 0.1% to about 25% of the non-volatile components.

Examples are:
isopropylthioxanthane,
acetophenone,
9,10-anthraquinone,
benzil,
benzil dimethyl ketal,
benzoin,
benzoin tetrahydropyranyl ether,
benzoin isobutyl ether,
benzophenone,
benzoyl cyclobutanone,
4,4'-bis(dimethylamino)benzophenone,
2,2-dimethyoxy-2-phenyl acetophenone,
dibenzosuberone, and
2-methyl-1-[4-methylthiophenyl]-2-morpholino propane.

Bases which are useful in the present invention are water-soluble or water dispersible, organic or inorganic bases. Preferred bases include alkali metal salts, e.g., lithium hydroxide, sodium hydroxide, potassium hydroxide. The alkali metal salts are desirable because they provide detackifying and antiblocking properties in the dried film. Other useable bases include amines. It is possible to use neutralizing bases that are mixtures of two or more of the alkali metal salts and amines. The amount of base which is used in the photoresist emulsions of the invention is that amount which is sufficient to neutralize 22% or less, preferably about 20% to about 5%, of the acid groups in the latex. That is, the amount of base used is no greater than about 0.22 equivalents per equivalent of acid, and preferably about 0.05 to about 0.15 equivalents per equivalent of acid. It is also possible to use mixtures of two or more bases to neutralize the acid groups.

Thickeners that may be used in the present invention include any of those known in the art. Example may be made, without limitation, to the following commercially available thickeners: Acrysol RM 825 (Rohm & Haas), Acrysol RM 2020 (Rohm & Haas), Acrysol SCT-270 (Rohm & Haas), DSX1514 (Henkel), DSX1550 (Henkel), DSX2000-EXP (Henkel). Other thickeners such as hydroxyethyl cellulose, hydrophobically-modified hydroxyethyl cellulose, and clays (e.g., Laponite), may also be used in the present invention.

In addition to the primary components, listed above, minor amounts (generally less than about 5 wt. % solids based on the total weight of solids of the emulsion) of conventional additives may be used. Example may be made, without limitation, to the following: antifoam agents, antioxidants, dyes, adhesion promoters, slip aids, surface tension modifiers, coalescing agents, and photopolymerization stabilizers. Commercially available stabilizers for negative photoactive photopolymers include hydroquinone, p-methoxyphenol and phenothiazine. Available pigments and dyes include any of those known in the art including, for example, Leuco Crystal Violet, Basacid Blue NB 755 (BASF), and Victoria Pure Blue BO. Suitable coalescing agents may include, but are limited to, glycol ethers and esters such as PM Acetate® (propylene glycol monomethyl ether acetate) from Eastman Chemical Co. and Butyl Dipropasol® dipropylene glycol monobutyl ether), Hexyl Carbitol® (hexyloxyethoxy ethanol) and UCAR® ester EEP (ethyl 3-ethoxy propionate) from Union Carbide. Suitable film aids include Byketrol-WS from BYK-Chemie and EFKA-LP 7022 from EFKA. Suitable adhesion promoters include benzotriazole and carboxybenzotriazole. Wetting agents include Dapro W-77 interfacial tension modifier from Daniel products. Wax additives include Paracal 802N wax emulsion from Hercules Chemical Corp. Modified polydimethylsiloxane anti-blocking and slip aids include Byk 333 (Byk Chemie) and Dow Q4-3667 (Dow Corning).

The composition may be coated by any of the coating systems known in the art for coating photoresist emulsion compositions, such as roll coating, dip coating, spray coating or curtain coating. The compositions of the present invention are applied in a conventional manner, either as liquid compositions directly to a metal clad blank laminate or to a polymeric support sheet to form a dry film. After coating, the composition is dried to remove water and other volatiles, such as ammonia or amine, coalescing solvent, and the like. As the photoimageable composition dries, the system coalesces into a continuous film. Drying is preferably carried out at somewhat elevated temperatures to hasten removal of the water and promote coalescence of the emulsion into a film. Drying may be carried out by any suitable means, including those commonly used to dry coatings. Example may be made, without limitation, to the following drying means: convection ovens, forced air ovens, IR ovens, and oven combining these features.

Processing is in a conventional manner. In a typical procedure, a photoresist composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as about 0.25% to about 3.0% by weight sodium or potassium hydroxide or carbonate. The alkali solution causes salt formation with the acid groups of the latex polymers, rendering them soluble and removable. After development, an etchant is typically be used to remove copper from those areas where the resist was removed, thereby forming a printed circuit. The remaining resist is then removed using an appropriate stripper.

In order to further illustrate the present invention and the advantages thereof, the following examples are provided. However, these examples are in no way meant to be limitative, but merely illustrative.

EXAMPLE 1

Preparation of Monomer Solution

A solution of monomers, photoinitiators and latent imaging dye was prepared by combining the following components and heating briefly to 50° C. with stirring:

| | |
|---|---|
| Sartomer 454 (Sartomer Inc.) | 42.70 g |
| Sartomer 349 (Sartomer Inc.) | 20.85 g |
| Sartomer 399 (Sartomer Inc.) | 5.35 g |
| Irgacure 651 (Ciba) | 8.82 g |
| Irgacure 907 (Ciba) | 20.23 g |
| Speedcure ITX (Quantacure) | 2.05 g |
| Leuco Crystal Violet | 2.00 g |

EXAMPLE 2

Preparation and Evaluation of 15% Neutralized Photoresist Emulsion

To 90.0 g Acrysol I-2074 acrylic emulsion (Rohm & Haas, acid value=160, Tg–138° C.) were added 18.3 g deionized water with stirring. A solution of 0.75 g LiOH.H$_2$O in 15.0 g deionized water was added dropwise over 5 minutes. The partially neutralized latex was stirred for an additional 30 minutes before adding 24.3 g of the monomer solution of Example 1 over 10 minutes. The photoresist emulsion was stirred rapidly for an additional 30 minutes before ultrasonicating 2 minutes with a Sonics & Materials 600 W disrupter using a ¾" high gain Q horn at an estimated 180 W level. The resulting 45% solids emulsion had a particle size distribution of D(v,0.5)=0.30 μm as measured on a Malvern Mastersizer and showed no evidence of instability.

Approximately 0.5 mil thick tack-free coatings of the invention could be prepared by casting the emulsion onto copper laminate and drying 5 minutes at 80° C. When exposed through a mask at 250 mJ/cm$^2$, developed in 0.9% Na$_2$CO$_3$ at 80° F. for 30 sec. and finally etched to remove unprotected copper, 1 mil lines were cleanly resolved.

EXAMPLE 3

Preparation of Monomer Solution

A solution of monomers, photoinitiators and latent imaging dye and stabilizer was prepared by combining the following components and heating briefly to 60° C. with stirring:

| | |
|---|---|
| Sartomer 454 (Sartomer Inc.) | 42.70 g |
| Sartomer 349 (Sartomer Inc.) | 20.85 g |
| Sartomer 399 (Sartomer Inc.) | 5.35 g |
| Irgacure 651 (Ciba) | 8.82 g |
| Irgacure 907 (Ciba) | 20.23 g |
| Speedcure ITX (Quantacure) | 2.05 g |
| Leuco Crystal Violet | 1.70 g |
| Methoxyhydroquinone | 0.19 g |

EXAMPLE 4

Preparation and Evaluation of Substantially Surfactant-Free Photoresist Emulsion To a quantity of Acrysol I-2074 latex was added LiOH.H$_2$O in water sufficient to neutralize 20% of the polymer acid groups and dilute the latex solids to 33 wt. %. This material was recirculated through a SI-1053 polysulfone ultrafiltration cartridge from Asahi Chemical Co. with a m.w. cutoff of 6,000 until the conductivity of the filtrate had dropped from 9,600 μS/cm to 800 μS/cm and the conductivity of the partially-neutralized latex had dropped from 7200 μS/cm to 2600 μS/cm. The wt. % solids of the filtrate during this time dropped from 2.97 wt. % to 0.6 wt. % . The wt. % solids of the resulting latex was 28 wt. %.

To 450 g of this latex was added 73.7 g of the monomer solution of Example 3 with stirring. After about 20 minutes the mixture was sonicated for 5 min. with a Sonics & Materials 600 W disrupter using a ¾" high gain Q horn at an estimated 180 W level. The mean particle size of the resulting 38% solids photoresist emulsion was 0.144 μm as measured on a Horiba LA-910 laser scattering particle size distribution analyzer.

To 500 g of this emulsion were added 0.23 g Keyacid Blue 2G (BASF), 1.86 g BYK-333 (BYK-Chemie), 6.25 g Acrysol RM 2020 thickener (Rohm & Haas, 20 wt. % solids) and 1.5 g RM 825 thickener (Rohm & Haas, 20 wt. % solids) with stirring for 20 minutes. This composition was then roll coated onto chemically cleaned copper laminate and dried 2 min. in a 100° C. convection oven to yield approximately 0.5 mil tack-free coatings. When exposed through a mask at 250 mJ/cm$^2$ and developed in 0.9% Na$_2$CO$_3$ at 90° F. for 48 sec. (3X breakpoint), 0.5 mil lines and spaces were cleanly resolved.

EXAMPLE 5

Preparation and Evaluation of Latex Containing only Anionic Surfactant

An acrylic copolymer latex was prepared as follows:

| | |
|---|---|
| Methyl methacrylate | 61 g |
| Ethyl acrylate | 14 g |
| Methacrylic Acid | 25 g |
| Methyl thioglycolate | 1 g |

To a 500 mL 3 neck flask fitted with stirrer, thermometer, condenser and dropping funnel were charged 146 g deionized water, 2 g sodium dodecylbenzenesulfonate, and ⅛ (101 g) of the monomer solution. The mixture was heated to 75° C. with stirring, and then a solution of 0.4 g ammonium persulfate in 10 g water was added. The ensuing reaction exotherm caused the temperature to rise to 80° C. The remaining monomer solution was added to the reaction mixture via the dropping funnel in 1010 g aliquots over 2 hours while maintaining the temperature between 78 and 82° C. After all of the monomer solution had been added, the emulsion was held at 75° C. for an additional 2 hours and then cooled to room temperature before passing through a #100 mesh screen. The resulting latex was 40 wt. % solids and had a pH of 2.3. The $T_g$ and acid value of the polymer were calculated to be 100° C. (Fox equation) and 160, respectively. The Mw and Mn were 16,700 and 7,000, respectively, with a polydispersity of 2.4 as determined by GPC.

To 30.0 g of this latex was added a solution of 0.226 g LiOH.H$_2$O in 7.04 g deionized water dropwise over 5 minutes. The partially neutralized latex was stirred for an additional 30 minutes before adding 7.39 g of the monomer solution described in Example 3 over 10 minutes. The photoresist emulsion was stirred rapidly for an additional 30 minutes before ultrasonicating for 30 sec. with a Sonics & Materials 600 W disrupter using a ¾" high gain Q horn at an estimated 180 W level. The resulting 45 wt. % solids emulsion had a particle size distribution of D(v,0.5)=0.30 μm and D(v,0.9)=0.76 μm as measured on a Malvern Mastersizer and showed no evidence of instability.

To 40.0 g of this emulsion were added 0.028 g Basacid Blue NB 755 (BASF), 0.5 g Acrysol RM 2020 associative thickener (Rohm & Haas), and 0.1 g Acrysol RM 825 associative thickener (Rohm & Haas) with stirring for 20 minutes.

Approximately 0.5 mil thick tack-free coatings of the invention could be prepared by coating the emulsion onto copper laminate using a Meyer rod and drying 2 minutes at 100° C. When exposed through a mask at 250 mJ/cm$^2$ and developed in 0.9% $Na_2CO_3$ at 90° F. for 17 sec. 0.5 mil resist lines were cleanly resolved.

EXAMPLE 6

Attempted Preparation of Unneutralized Photoresist Emulsion

When Example 2 was repeated without neutralization the mixture coagulated even before all of the monomer/photoinitiator solution could be added (see 0% Neutralization in table below).

EXAMPLE 7

Effect of Neutralization Level on Monomer Absorption

The importance of neutralization level in effecting efficient monomer absorption even when using ultrasound is shown in the table below (all samples prepared as in Example 2 except for LiOH level):

| % Neutralization | D(v,0.5) (μm) | D(v,0.9) (μm) |
|---|---|---|
| 20 | 0.31 | 0.51 |
| 15 | 0.30 | 0.53 |
| 5 | 0.34 | 0.61 |
| 2.5 | 0.45 | 0.90 |
| 1 | 0.85 | 5.53 |
| 0 | — | — |

At 1% or less neutralization the resulting particle size reduction is insufficient to form a stable emulsion.

The particle size distribution of the 15% neutralized latex before monomer addition is almost identical to that after monomer addition.

EXAMPLE 8

Preparation of Monomer Solution

A solution of monomers, photoinitiators, stabilizer, adhesion promoter and latent imaging dye was prepared by combining the following components and heating to 550°–60° C. with stirring:

| | |
|---|---|
| Sartomer 454 (Sartomer Inc.) | 1281.0 g |
| Sartomer 349 (Sartomer Inc.) | 625.5 g |
| Sartomer 399 (Sartomer Inc.) | 160.5 g |
| Irgacure 651 (Ciba) | 264.6 g |
| Irgacure 907 (Ciba) | 606.9 g |
| Speedcure ITX (Quantacure) | 61.5 g |
| Methoxyhydroquinone | 5.8 g |
| Benzotriazole | 8.2 g |
| Leuco Crystal Violet | 42.0 g |

EXAMPLE 9

Attempted Preparation of Photoresist Emulsion without Comminution

To 50.0 g Acrysol I-1074 was added a solution of 0.417 g $LiOH.H_2O$ in 7.96 g deionized water slowly with stirring. The partially neutralized latex was stirred for an additional 30 minutes before adding 9.04 g deionized water followed by 13.51 of the monomer solution for Example 8. The sample was stirred overnight. Although the mean particle size was quite low (0.138 μm), the material separated into two layers after standing for about 24 hours.

EXAMPLE 10

Attempted Preparation of Photoresist Emulsion without Comminution Using Elevated Temperature When the experiment described in Example 9 was repeated with heating of the emulsion at 40° C. the result was nearly identical.

EXAMPLE 11

Attempted Preparation of Photoresist Emulsion without Comminution Using Additional Surfactant The experiment described in Example 9 was repeated except that 1.23 g Polystep A 16-22 (Sodium dodecyl benzene sulfonate, Stepan Co.) were dissolved in the 9.04 g deionized water. The result was nearly identical.

EXAMPLE 12

Attempted Preparation of Photoresist Emulsion Using a Higher Neutralization Level An emulsion of the same composition as that described in Example 2 above was prepared except that it was neutralized 50% with $NH_4OH$. After combining the monomer solution with the latex via simple stirring, the particle size distribution was very broad; D(v,0.5)=8.65 μm and D(v,0.9)=30.09 μm as measured on Malvern Mastersizer; the emulsion formed precipitate after several hours in spite of a viscosity higher than that of material with a lower neutralization level. After ultrasonicating this emulsion for 2 minutes the particle size distribution—D(v,0.5)=0.47 μm and D(v,0.9)=2.03 μm—improved, but was not stable enough to prevent precipitation within a few days. It appears that at higher levels of neutralization, the latex particles are swollen and less able to stabilizer hydrophobic monomers.

EXAMPLE 13

Preparation of Monomer Pre-Emulsion 4.93 g Polystep A-16-22 (Stepan Co.) were dissolved in 36.15 g deionized water. To this solution were added 54.04 g of the monomer solution described in example 8 with stirring. The mixture was ultrasonicated for 1 minute with a Sonics & Materials 600 W disrupter using a ¾" high gain Q horn at an estimated 180 W level. The resulting stable emulsion had a mean particle size of 0.373 μm and a unimodal distribution as measured on a Horiba LA-910 laser scattering particle size distribution analyzer.

EXAMPLE 14

Preparation of Partially Neutralized Photoresist Emulsion

To 50.0 g Acrysol I-2074 acrylic emulsion (Rohm & Haas), acid value=160, $T_g$=138° C.) was added a solution of 0.417 g $LiOH.H_2O$ in 7.96 g deionized water dropwise with stirring. After 30 minutes 23.78 g of the monomer pre-emulsion of Example 13 was added. After about 10 minutes the emulsion had a mean particle size of 0.152 µm and a unimodal distribution as measured on a Horiba LA-910 laser scattering particle size distribution analyzer. After stirring overnight the mean particle size had decreased to 0.130 µm and the emulsion was still stable. The mean particle size of the unmodified Acrysol I-2074 latex was 0.123 µm, indicating that the monomer pre-emulsion had been adsorbed into the latex.

EXAMPLE 15

Attempted Preparation of Unneutralized Photoresist Emulsion

A photoresist was formulated as above except no LiOH.H$_2$O was used when the Acrysol I-2074 latex was diluted. Upon adding the monomer pre-emulsion the mixture became quite viscous. Sufficient water was added to permit stirring. The particle size distribution at this point was very broad and bimodal with a mean of 17.779 µm. After stirring overnight the mean increased. After sitting for several hours the mixture separated into two phases.

EXAMPLE 16

Preparation of Monomer Solution

A solution of monomers, photoinitiators and latent imaging dye was prepared by combining the following components and heating briefly to 60° C. with stirring:

| Sartomer 454 (Sartomer Inc.) | 1195.6 g |
|---|---|
| Sartomer 349 (Sartomer Inc.) | 583.8 g |
| Sartomer 399 (Sartomer Inc.) | 149.8 g |
| Irgacure 651 (Ciba) | 246.96 g |
| Irgacure 907 (Ciba) | 566.44 g |
| Speedcure ITX (Quantacure) | 57.4 g |
| Leuco Crystal Violet | 39.2 g |

EXAMPLE 17

Adverse Effects of High Levels of Associative Thickener on Sticking/Blocking of Coated Boards To 246.6 g Acrysol I-2074 was added a solution of 2.04 g LiOH.H$_2$O in 112.26 g deionized water slowly with stirring. The partially neutralized latex was stirred for an additional 30 minutes before adding 89.1 g of the monomer solution of Example 16 over 10 minutes. The photoresist emulsion was then ultrasonicated for 5 minutes with a Sonics & Materials 600 W disrupter using a ¾" high gain Q horn at an estimated 180 W level. The resulting 45 wt. % solids emulsion had a mean particle size of 0.127 µm as measured on a Horiba LA-910 particle size analyzer. To this emulsion were added 0.70 g Keyacid Blue 2G (BASF), 2.62 g BYK-333 (BYK-Chemie), 5.48 g Acrysol RM 2020 thickener (Rohm & Haas, 20 wt. % solids) and 1.10 g RM 825 thickener (Rohm & Haas, 20 wt. % solids) with stirring. The total level of thickener in this formula on a solids basis was 0.65 wt. %.

To 75 g of this composition were added an additional 7.5 g RM 2020 to make a total thickener level on a solids basis of 2.65 wt. %.

Approximately 0.5 mil thick coatings of both of the formulations were prepared on copper laminate using a #22 Meyer rod and drying 2 min. at 110° C. 6"×6" coated boards were stacked face-to-face under 0.66 psi/in$^2$ pressure in two stacks. The boards were checked after 24 and 96 hours for sticking and/or blocking. Sticking refers to any adhesion between the coatings such that effort is required to separate the boards, usually accompanied by a strong "peel sound". Blocking refers to actual transfer of resist material from one coating to another. The results are shown in the table below.

| Thickener Level | 24 hours | 96 hours |
|---|---|---|
| 0.65% | no sticking | no sticking |
| 2.65% | sticking | sticking, some blocking |

EXAMPLE 18

Addition of Thickener, without Neutralization, in Attempt to prepare a Higher Solids (45%) Photoresist Emulsion 90 g of Acrysol I-2074 were diluted with 31 g of deionized water. 10.35 g Acrysol RM 2020 associative thickener (3.2% on a solids/solids basis) were added with stirring, after which the emulsion became very viscous. 24.3 g of the monomer solution from Example 16 was added with stirring after which the viscosity decreased significantly. After 1 hour the mixture still contained what appears to be coagulum and had a mean particle size of 25.7 µm as measured on a Horiba LA-910 particle size analyzer. After stirring overnight the mean particle size had dropped to 4.07 µm but still contained coagulum. When stirring was stopped the material separated into two layers.

EXAMPLE 19

Preparation of 55% Solids Photoresist Emulsion

To 367.6 g of Acrysol I-2074 were added 3.24 g of NaOH dissolved in 26.5 g of deionized water slowly with stirring. The partially neutralized latex was stirred for an additional 15 minutes before adding 105.9 g of monomer solution identical in composition to that described in Example 3. After stirring this mixture for 15 minutes it was passed through a Union Homogenizer model HTD1 bench top homogenizer at 8,000 psi, resulting in a stable emulsion with a mean particle size of 0.124 µm as measured on a Horiba LA-910 particle size analyzer. To 441.7 g of this emulsion were added 0.71 g Keyacid Blue 2G (BASF), 4.42 g Dow Corning Q4-3667 silicone fluid, 4.05 g Acrysol RM 2020 thickener (Rohm and Haas, 20 wt. % solids) and 0.81 g RM 825 thickener (Rohm and Haas, 20 wt. % solids) with stirring. The total thickener level of this formulation is 0.4 wt. % on a solids basis.

This material was roll coated using a Black Brothers roll coater onto chemically cleaned copper laminate and then dried 1 minute in a 110° C. oven to yield a 0.5 mil thick dry, tack-free films. Coated panels were stacked together for 72 hours under 0.66 psi in a room with 50% relative humidity; when unstacked there was no sticking or resist transfer whatsoever.

When the dried coatings were exposed through a mask at 175 mJ/cm$^2$ and developed in a 0.9% Na$_2$CO$_3$ spray at 90° F. for 12 sec. (twice breakpoint), the resist held a Stouffer gauge-step 8 (21 step Stouffer gauge) and 1 mil lines and spaces were cleanly resolved.

EXAMPLE 20

High Solids, Low Viscosity Emulsion with Low Level of Thickener

The composition described in example 19 was scaled up to 30 gallons using an APV Gaulin Homogenizer at 8,000 psi, but the associative thickeners and Dow Corning Q4-3667 anti-blocking additive were withheld (this is Composition A). The Brookfield viscosity of this emulsion was only 80 centipoise in spite of the relatively high solids level. This material could be roll coated on a Black Brothers roll coater or thickened as follows using relatively low levels of associative thickeners to provide compositions also of suitable coating viscosities. The viscosities listed were measured at 1,000 s$^{-1}$ ("high shear rate" viscosity) on a Contraves viscometer.

Composition B: Composition A with 1.8 wt. % (solids basis) Dow Corning Q4-3667, 0.15 wt. % (solids basis) Acrysol RM 2020, and 0.03 wt. % (solids basis) Acrysol RM 825 (0.18 wt. % total thickener). The viscosity was 276 centipoise.

Composition C: Composition A with 1.8 wt. % (solids basis) Dow Corning Q4-3667, 0.24 wt. % (solids basis) Acrysol RM 2020, and 0.05 wt. % (solids basis) Acrysol RM 825 (0.29 wt. % total thickener). The viscosity was 524 centipoise.

Composition D: Composition A with 1.8 wt. % (solids basis) Dow Corning Q4-3667, 0.33 wt. % (solids basis) Acrysol RM 2020, and 0.07 wt. % (solids basis) Acrysol RM 825 (0.40 wt. % total thickener). The viscosity was 853 centipoise.

Compositions B and D were roll coated on a Burkle double sided roll coater to yield well-leveled dried films of about 0.95 mils thickness. However, when Composition D was diluted to 45 wt. % solids and roll coated under the same conditions, dried films no thicker than about 0.75 mils could be obtained.

This example demonstrates that relatively high solids, low viscosity emulsions may be prepared. Also demonstrated is the ease with which the viscosity may be adjusted for coating, even with relatively low levels of thickener. The effect of moderate changes in solids level on dried film thicknesses is also demonstrated.

EXAMPLE 21

Blocking in Films Produced from Unthickened Emulsions vs. Emulsions Thickened at 1 wt. % or Greater Three additional compositions were prepared using Composition A, from Example 20, above:

Composition E: Composition A with 0.83 wt. % (solids basis) Acrysol RM 2020 (thickener), and 0.17 wt. % (solids basis) Acrysol RM 825 (thickener). [1 wt. % total thickener].

Composition F: Composition E with 1.8 wt. % (solids basis) Dow Corning Q4-3667 (anti-blocking agent). [1 wt. % total thickener]

Composition G: Composition A with 1.8 wt. % (solids basis) Dow Corning Q4-3667 (anti-blocking agent), 2.5 wt. % (solids basis) Acrysol RM 2020 (thickener), and 0.5 wt. % (solids basis) Acrysol RM 825 (thickener). [3 wt. % total thickener].

Composition A describes an unthickened emulsion. Compositions E, F and G describe emulsions with associative thickener levels representative of those used in the prior art.

Due the high viscosities caused by the relatively high thickener levels, Compositions E and F had to be diluted to about 44.6 wt. % solids to provide adequate roll coating viscosity, and Composition G had to be diluted to about 38.4 wt. % solids. Compositions A, E, F and G were then roll coated, on a Black Brothers roll coater, onto 9"×6" panels and dried for 2 minutes in a 110° C. oven to provide approximately 0.5 mil thick films. The dried panels were stacked together under a pressure of 0.66 psi/in$^2$ in a room at 72° F. with 50% relative humidity for 72 hours. The results were as follows:

Composition A (no thickener): No sticking or blocking.

Composition E (1 wt. % thickener): Extreme sticking; 15–20% blocking/transfer of resist.

Composition F (1 wt. % thickener with anti-block): No sticking or blocking

Composition G (3 wt. % thickener with anti-block): Slight sticking with scattered spots of blocking transfer.

These results demonstrate that when no associative thickener is used there is no sticking or blocking, even without the use of an anti-blocking additive. However, when associative thickener was used at 1 wt. %, representative of the prior art, anti-blocking agent was necessary to prevent blocking; and when associative thickener was used at higher levels, i.e. at 3 wt. %, even anti-blocking additives were unable to overcome sticking and blocking.

EXAMPLE 22

Storage Stability of Unneutralized Thickened Emulsions

To 60.0 g Acrysol I-2074 acrylic emulsion (Rohm & Haas) were added 69.8 g deionized water with stirring followed by 6.9 g Acrysol RM 2020 associative thickener (Rohm & Haas, 5 wt. % thickener on a solids basis). 16.2 g of the monomer solution described in example 8 were added slowly. After stirring overnight the mean particle size was 0.27 mm and the distribution was substantially unimodal; however within three months the emulsion had separated into two layers.

This example demonstrated the poor long term stability of unneutralized emulsions prepared using higher levels of associative thickener.

We claim:

1. A stable waterborne photoresist emulsion composition comprising:

(a) between about 30 and about 80 weight percent, based upon total solids content, of an acid functional polymer having an acid number between about 50 and about 300;

(b) between about 15 and about 50 weight percent, based upon total solids content, of alpha, beta ethylenically unsaturated monomers;

(c) between about 0.1 and 25 weight percent, based upon total solids content, of photoinitiator;

wherein the polymer component (a) is neutralized at no greater than about 0.22 equivalents per equivalent of acid functionality;

wherein the particle size distribution of the emulsion having a D(v,0.9) is less than 1.4 microns; and wherein the total solids content of the emulsion is greater than 25 percent by weight based upon the total weight of the emulsion.

2. A waterborne photoresist emulsion composition of claim 1 wherein the total solids content of the emulsion is greater than 35 percent by weight based upon the total weight of the emulsion.

3. A waterborne photoresist emulsion composition of claim 2 wherein said polymer (a) is neutralized at about 0.05 to about 0.15 equivalents per equivalent of acid functionality.

4. A waterborne photoresist emulsion composition of claim 1 wherein the total solids content of the emulsion is greater than 45 percent by weight based upon the total weight of the emulsion.

5. A waterborne photoresist emulsion composition of claim 4 wherein said polymer (a) is neutralized at about 0.05 to about 0.15 equivalents per equivalent of acid functionality.

6. A waterborne photoresist emulsion composition of claim 1 wherein said polymer (a) is neutralized at about 0.05 to about 0.15 equivalents per equivalent of acid functionality.

7. A method of making a waterborne photoresist emulsion comprising the steps of:

(a) partially neutralizing an acid functional latex polymer with base at about 0.01 to about 0.2 equivalents per equivalent of acid fuctionality;

(b) mixing the partially neutralized latex with a solution of photopolymerizable monomers and photoinitiators; and (c) comminuting the neutralized mixture under conditions which are sufficient to yield a stable, homogeneous photoresist coating material which has a particle size distribution having a D(v,0.9) of less than 1.4 microns;

wherein the total solids content of the emulsion is greater than 25 percent by weight based upon the total weight of the emulsion.

8. A method of making a waterborne photoresist emulsion of claim 7 wherein the total solids content of the emulsion is greater than 35 percent by weight based upon the total weight of the emulsion.

9. A method of making a waterborne photoresist emulsion of claim 7 wherein the total solids content of the emulsion is greater than 45 percent by weight based upon the total weight of the emulsion.

* * * * *